United States Patent [19]

Feintuch

[11] Patent Number: 4,939,685

[45] Date of Patent: Jul. 3, 1990

[54] NORMALIZED FREQUENCY DOMAIN LMS ADAPTIVE FILTER

[75] Inventor: Paul L. Feintuch, Covina, Calif.

[73] Assignee: Hughes Aircraft Company, Los Angeles, Calif.

[21] Appl. No.: 455,893

[22] Filed: Dec. 27, 1989

Related U.S. Application Data

[63] Continuation of Ser. No. 387,390, Jul. 28, 1989, abandoned, and a continuation of Ser. No. 871,008, Jun. 5, 1986, abandoned.

[51] Int. Cl.$^5$ .............................................. G06F 15/31
[52] U.S. Cl. ............................ 364/724.19; 364/724.18
[58] Field of Search ............... 364/724.19, 726, 724.18

[56] References Cited

U.S. PATENT DOCUMENTS

| | | | |
|---|---|---|---|
| 4,038,536 | 7/1977 | Feintuch | 364/724 |
| 4,052,559 | 10/1977 | Paul et al. | 333/166 |
| 4,177,430 | 12/1979 | Paul | 455/306 |
| 4,207,624 | 6/1980 | Dentino et al. | 364/724 X |
| 4,355,368 | 10/1982 | Zeidler et al. | 364/724 X |
| 4,649,505 | 3/1987 | Zinser, Jr. et al. | 364/724 X |
| 4,658,426 | 4/1987 | Chabries et al. | 381/94 |
| 4,791,390 | 12/1988 | Harris et al. | 333/166 |

OTHER PUBLICATIONS

Kalman et al. Ed., "*Aspects of Network and System Theory*", Holt, Rinehart and Winston, 1971, pp. 563-587.
Bershad et al., "*A Normalized Frequency Domain LMS Adaptive Algorithm*", IEEE Trans. on Acoustics, Speech, and Signal Processing, vol. ASSP, No. 3, Jun. 1986, pp. 452-461.
Griffiths, "*Rapid Measurement of Digital Frequency*", Apr. 1975, pp. 207-222, IEEE Transactions on Acoustics, Speech and Signal Processing, vol. ASSP-23.
Bershad et al., "*Tracking Characteristics of the LMS Adaptive Line Enhancer-Response to a Linear Chirp Signal in Noise*", IEEE Transactions on Acoustics, Speech and Signal Processing, vol. ASSP-28, No. 5, pp. 504-516, Oct., 1980.
Dentino et al., "*Adaptive Filtering in the Frequency Domain*", Proceedings of the IEEE, vol. 66, pp. 1658-1659, Dec., 1978.
Clark et al., "Block Implementation of Adaptive Digital Filters", IEEE Transactions on Acoustics, Speech and Signal Processing, vol. ASSP-29, No. 3 ... continued ... pp. 747-752, Jun. 1981.
Reed et al., "*A Comparison of LMS Adaptive Cancellers Implemented in the Frequency Domain and the Time Domain*", IEEE Transactions on Acoustics, Speech and Signal Processing, vol. ASSP-29, No. 3, pp. 770-775, Jun. 1981.
Ogue et al., "*A Fast Convergence Frequency Domain Adpative Filter*", IEEE Transactions on Acoustics, Speech and Signal Processing, vol. ASSP-31, No. 5, pp. 1312-1314, Oct., 1983.

*Primary Examiner*—Gary V. Harkcom
*Assistant Examiner*—Tan V. Mai
*Attorney, Agent, or Firm*—W. K. Denson-Low

[57] ABSTRACT

A normalized frequency domain Least Means Square filter. The feedback coefficient for each frequency bin is adjusted separately in the filter by use of an input power estimate. The power estimate is incorporated directly into the filter algorithm as a data-dependent, time-varying stochastic feedback coefficient. The filter is particularly useful in applications in which the input signal has large spectral variations, which could lead to filter instabilities in some frequency bins if a single feedback coefficient were employed in all frequency bins.

11 Claims, 2 Drawing Sheets

NORMALIZED FREQUENCY DOMAIN LMS ADAPTIVE FILTER

This is a continuation of application Ser. No. 387,390 filed July 29, 1989, now abandoned, and a continuation of application Ser. No. 871,008, filed June 5, 1986, now abandoned.

BACKGROUND OF THE INVENTION

The present invention relates to frequency domain Least Mean Square (LMS) filters, and more particularly, to an LMS filter whose operation is normalized in each frequency bin by the spectral power in that bin, thereby providing stable filter operation in each frequency bin even for an input signal having differing signal powers in each frequency bin.

The time-domain LMS adaptive filter algorithm has found may applications in situations where the statistics of the input processes are unknown or changing. These include noise cancellation, line enhancing, and adaptive array processing. The algorithm uses a transversal filter structure driven by a primary input, so as to minimize the mean-square error of the difference.

In general, the stability, convergence time, and fluctuations of the adaptation process are governed by the product of the feedback coefficient $\mu$ and the input power to the adaptive filter. As a result, in practical applications, there is an implicit automatic gain control (AGC) on the input to the adaptive filter. The AGC ensures that the $\mu$-power product is maintained within acceptable design limits. When the adaptive filter is implemented as a tapped delay line operating on the entire available input signal bandwidth, selection of a single value $\mu$ is required. Then, the algorithm convergence time and stability depends upon the ratio of the largest to the smallest eigenvalues associated with the correlation matrix of the input sequence. The smaller the ratio, the better the convergence and misadjustment noise properties of the algorithm.

More recently, the computational efficiencies resulting from processing blocks of data, such as the fast Fourier transform (FFT) and block digital filtering, has led to the implementation of the LMS adaptive algorithm in the frequency domain. The primary and reference channels are both transformed, and an adaptive weight is placed between them on each frequency bin. The LMS algorithm reduces to a single complex weight and the feedback sequence of errors is just the error computed in each bin.

In addition to the computational advantages of the frequency domain adaptive filter (FDAF), significant analytical advantages, compared to the time domain LMS adaptive filter, occur when using the FDAF, e.g., for determining first and second-moment properties of the FDAF complex weights, and under certain mild conditions, for predicting the performance of the time domain LMS adaptive filter.

When evaluating the performance of the FDAF, it is still implicitly assumed that some sort of gain control exists so that the feedback coefficient $\mu$ on each complex weight update, can be selected for a known input power. If the input waveform is spectrally flat over the band, then the same broad-band AGC used in the tapped delay line implementation will suffice for each frequency bin. In most practical cases, this is how the frequency domain adaptive filter is configured.

The non-spectrally flat case for which the powers in each bin differ (perhaps dramatically) presents a problem. In some applications, where rapid convergence is necessary and a single $\mu$ is used based on the broad-band power level, the increase in spectral level in some bins may cause instability in the adaptive weights at those frequencies. This corresponds to the time-domain case where the ratio of the largest to smallest eigenvalue of the data covariance matrix is very large.

There is therefore a need for a frequency domain LMS filter which provides stable operation for non-spectrally flat input signals.

SUMMARY OF THE INVENTION

A normalized frequency domain Least Mean Square filter is disclosed, wherein the feedback coefficient for each frequency bin of the filter is normalized with an estimate of the input spectral power within that frequency bin. The feedback coefficient is determined by (i) fixing the value of a feedback constant, (ii) for each frequency bin determining an estimate of the spectral power of the input signal within the particular frequency bin, and (iii) for each frequency bin, normalizing the feedback constant by the corresponding estimate of the input spectral power to provide individual normalized feedback coefficients for each of the frequency bins. The latter two steps are then iterated for successive samples of the input signal taken over an observation time interval. Exemplary techniques for determining an estimate of the input signal power for a particular frequency bin include a recursive formulation for calculating the estimate in dependence on the estimate for the preceding sample and the present magnitude of the input signal in the frequency bin, and formulations for determining estimates of the average power in the input signal sequence.

BRIEF DESCRIPTION OF THE DRAWINGS

These and other features and advantages of the present invention will become more apparent from the following detailed description of exemplary embodiments thereof, as illustrated in the accompanying drawings, in which.

DETAILED DESCRIPTION OF THE DISCLOSURE

Figure 1:
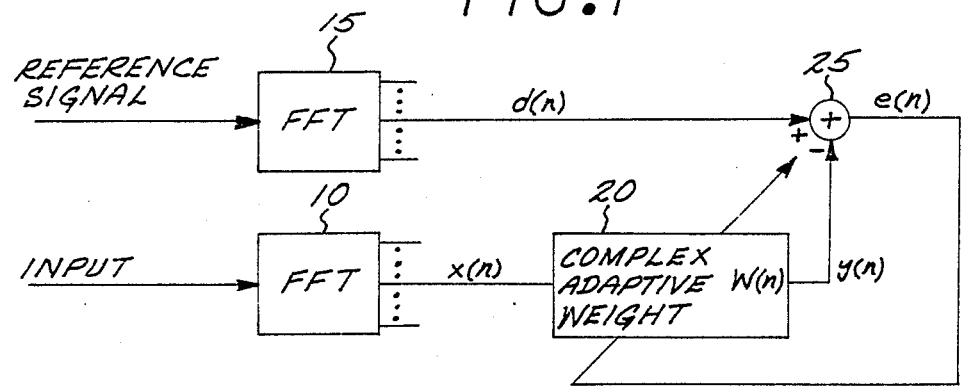
FIG. 1 is a block diagram of an exemplary adaptive filter in the frequency domain.

FIG. 1 is a block diagram of the frequency domain adaptive filter. The input signal is fast Fourier transformed into the frequency domain by a first fast Fourier transform (FFT) device 10, which provides a plurality of frequency bin output sequences, including the frequency bin sequence x(n). The reference signal is fast Fourier transformed by a second FFT device 15 to provide a corresponding plurality of frequency bin output sequences, including the exemplary reference frequency bin sequence d(n).

The fast Fourier transform is well known in the art. An exemplary reference on FFTs is "Theory and Application of Digital Signal Processing," by L. Rabiner and B. Gold, Prentice Hall, 1975. The FFT is often implemented in digital circuits, wherein the input and reference waveforms are converted to digital (binary-leveled) signals by analog-to-digital converters (not shown), which are operated at a sample rate of at least the Nyquist sample rate (the inverse of twice the input signal bandwidth). The notations $x(n)$ and $d(n)$ refer to the nth sample of the respective input and reference waveforms in a particular data sequence during the observation time.

The output $x(n)$ of FFT device 10 is weighted by a complex adaptive weight $W(n)$ at filter 20 to provide the filter output $y(n) = W(n)x(n)$, as will be described in more detail with respect to FIGS. 3, 4 and 5. Generally, the filter output $y(n)$ is subtracted from the reference FFT sequence $d(n)$ at combiner device 25 to provide the error waveform $e(n)$, which is fed back to filter 20 to update the complex weight $W(n)$.

If the input processes to the FFT devices 10 and 15 are wide-sense stationary over the observation time, then disjoint spectral outputs or bins are uncorrelated. Assuming the inputs are joint Gaussian random processes, the disjoint bins provide statistically independent outputs. Thus, each complex tap or weight is operating on independent data. Furthermore, since the FFT operations are linear operations on the joint Gaussian input sequences, the outputs of the respective FFT devices 10 and 15 are jointly complex Gaussian sequences.

The filter weight update equation is given by $$W(n+1) = W(n) + \mu e(n)x^*(n) \quad \text{(Eq. 1)}$$

where
$W(n)$ = complex scalar weight on the nth iteration
$e(n)$ = error waveform = $d(n) - y(n)$
$y(n)$ = filter output = $W(n)x(n)$
$d(n)$ = reference waveform
$x(n)$ = input data sequence
$x^*(n)$ = complex conjugate of $x(n)$
$\mu$ = feedback coefficient It is assumed that both $d(n)$ and $x(n)$ contain a desired component, buried in statistically independent Gaussian additive noises. $\rho$ is the complex correlation coefficient of the desired signal that the adaptive device wishes to select so as to minimize $E(|e(n)|^2)$. The relevant statistics of $d(n)$ and $x(n)$ are given by Eqs. 2-6.

$$E[x(n)] = E[d(n)] = 0 \quad \text{(Eq. 2)}$$

$$E[|x(n)|^2] = \sigma^2 = E(|d(n)|^2), E[x^2(n)] = E[d^2(n)] \quad \text{(Eq. 3)}$$

$$E[d(n)x^*(n)] = \rho\sigma^2 \quad \text{(Eq. 4)}$$

$$E[d(n)x(n)] = 0 \quad \text{(Eq. 5)}$$

$$E[x(n)x^*(m)] = 0, n \neq m, E[d(n)d^*(n)] = 0, n \neq m \quad \text{(Eq. 6)}$$

Thus, it is assumed that the input sequences are zero mean complex circular Gaussian processes that are uncorrelated over time.

Eq. 1 can be rewritten as $$W(n+1) = W(n)[1 - \mu|x(n)|^2] + \mu d(n)x^*(n). \quad \text{(Eq. 7)}$$

In accordance with the invention, a normalized frequency domain adaptive filter (NFDAF) algorithm is obtained by providing a variable data-dependent $\mu(n)$, which is normalized by an estimate of the input spectral power in the particular frequency bin, $$W(n+1) = W(n)[1 - \mu(n)|x(n)|^2] + \mu(n)d(n)x^*(n) \quad \text{(Eq. 8)}$$

Three exemplary schemes are presented for obtaining input power estimates $\hat{\sigma}^2(n)$ for setting the algorithm gain parameter in the frequency domain LMS adaptive algorithm. The estimates are incorporated directly into the algorithm as a data dependent time varying stochastic feedback coefficient $\mu(n)$. The three suggested methods for estimating $\mu(n)$ are denoted by $\mu_1(n)$, $\mu_2(n)$, and $\mu_3(n)$. The first method, $\mu_1(n)$, is a recursive method, given by Eq. 9 and 10.

$$\mu_1(n) = \frac{\mu_0}{\hat{\sigma}^2(n)} \quad \text{(Eq. 9)}$$

$$\hat{\sigma}^2(n+1) = (1-\alpha)\hat{\sigma}^2(n) + \alpha|x(n)|^2 \quad \text{(Eq. 10)}$$

where $$\hat{\sigma}^2(0) = 0 \text{ and } 0 < \alpha < 1$$

The constant $\alpha$ is a variable parameter that determines how much "new" data is weighed relative to "old" data. If $\alpha = 0$, then the algorithm never forgets, and if $\alpha \approx 1$ then it forgets very quickly and relies more heavily on new data.

Figure 2:
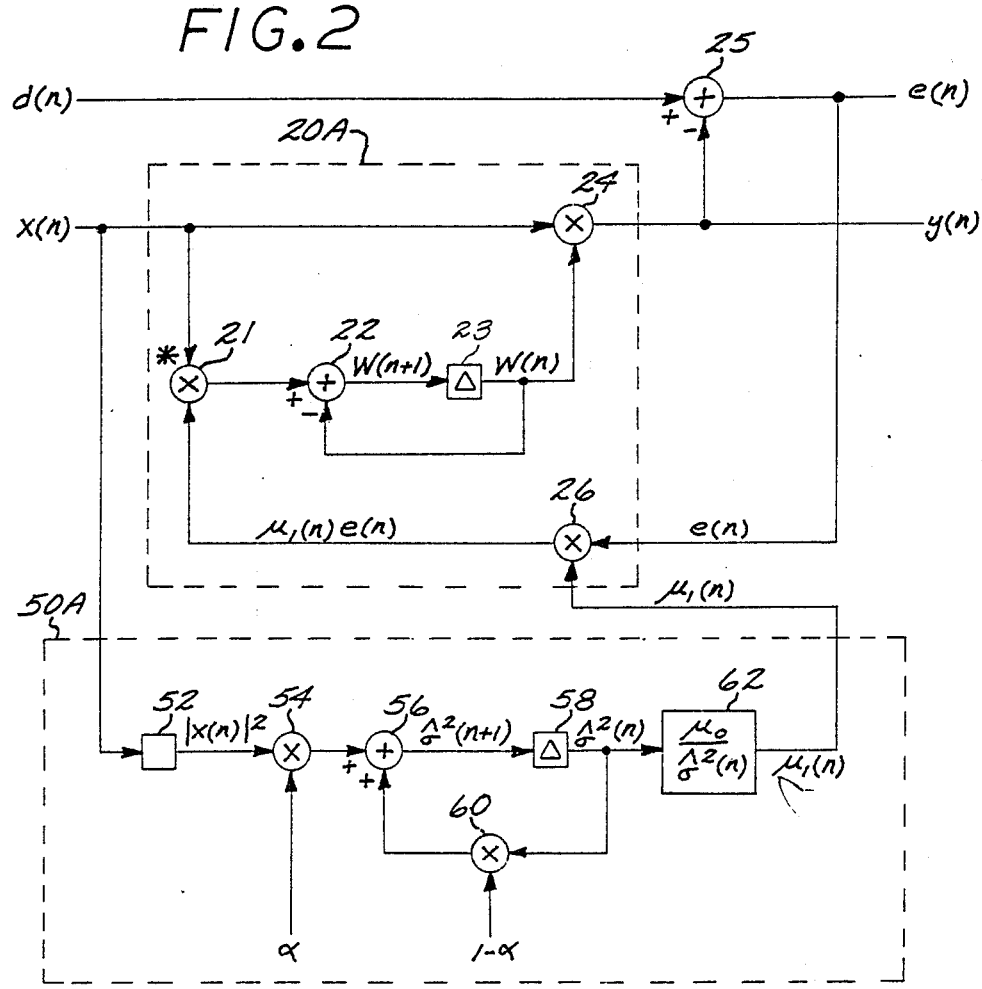
FIG. 2 is a block diagram of a first embodiment of a normalized frequency domain adaptive filter employing the invention.

FIG. 2 is a block diagram of an exemplary frequency bin of an NFDAF employing the recursive technique to provide the frequency dependent factor $\mu_1(n)$. As discussed above in reference to FIG. 1, the transformed input signal sequence $x(n)$ is filtered by the filter 20A, and the filter output $y(n)$ is subtracted from the reference signal waveform $d(n)$ at combiner 25 to provide the error waveform $e(n)$. The error waveform is fed back to the filter 20A to update the complex weight $W(n)$ of the filter. In this case, the feedback coefficient $\mu_1(n)$ is data dependent and determined by circuits 50A.

In filter 20A, the complex conjugate of the input signal sequence is multiplied at multiplier 21 with the product of the normalized feedback coefficient and the error waveform, and the resultant product is summed at combiner 22 with the weight $W(n)$ for the nth iteration to form the weight $W(n+1)$ for the next iteration. The weight $W(n+1)$ is delayed by one sample time unit to form the weight $W(n)$, which is fed back to combiner 22. The input sequence $x(n)$ is multiplied by $W(n)$ at multiplier 24 to form the filter output $y(n)$.

The feedback coefficient circuit 50A processes the input signal sequence $x(n)$ to provide a power-normalized feedback coefficient. At device 52, the magnitude of the respective samples of the input signal is squared, and the result is multiplied by the scale factor $\alpha$ at multiplier 54. The product is then summed at combiner 56 with a scaled one-sample-time-unit-delayed version to form the power estimate $\hat{\sigma}^2(n+1)$ for the next iteration. This estimate is delayed by one sample time unit at delay 58 to form the current power estimate $\hat{\sigma}^2(n)$. This estimate is multiplied by $(1-\alpha)$ at multiplier 60 and fed back to combiner 56.

Device 62 indicates a division process, wherein the constant $\mu_0$ is divided by the power estimate $\sigma^2(n)$ to form the data dependent feedback coefficient $\mu_1(n)$. The coefficient is coupled to multiplier 26 of the filter 20A, to form the multiplication product $\mu_1(n)e(n)$. The NFDAF depicted in FIG. 2 is then replicated for each of the frequency bins formed by the FFT process.

The other two exemplary methods for calculating employ moving blocks of data.

$$\mu_2(n) = \mu_0 \left( \frac{1}{N} \sum_{i=0}^{N-1} |x(n-i)|^2 \right)^{-1} \quad \text{(Eq. 11)}$$

$$\mu_3(n) = \mu_0 \left( \frac{1}{N} \sum_{i=1}^{N} |x(n-i)|^2 \right)^{-1} \quad \text{(Eq. 12)}$$

and where $\mu_0$=constant. $\mu_2(n)$ does not include the present data sample in the power estimate. $\mu_3(n)$ does include the present data sample. The terms in brackets of Eqs. 11 and 12 are unbiased estimates of the average power in the input data sequence.

Figure 3:
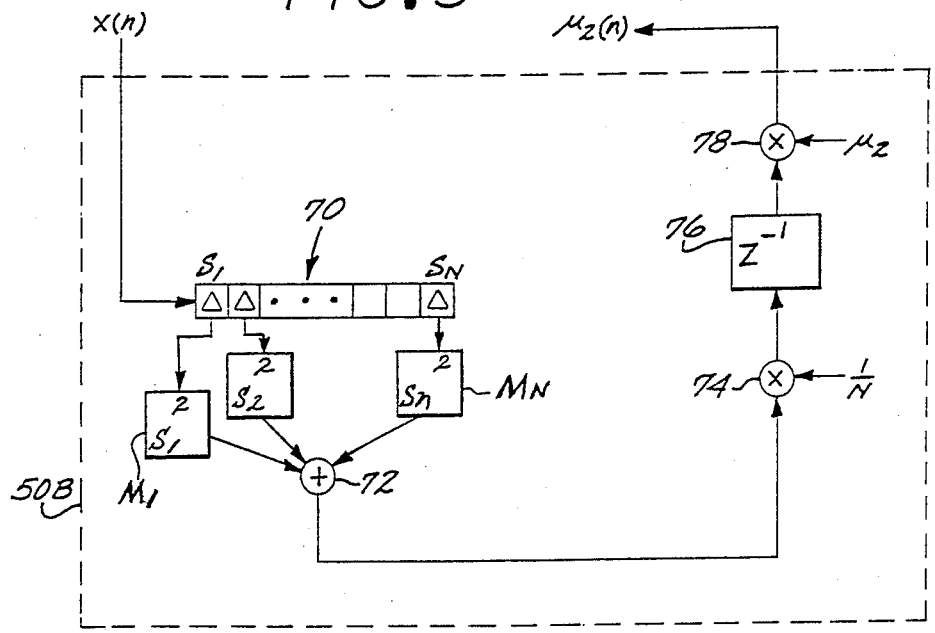
FIG. 3 is a block diagram of a second embodiment of a normalized frequency domain adaptive filter employing the invention.
Figure 4:
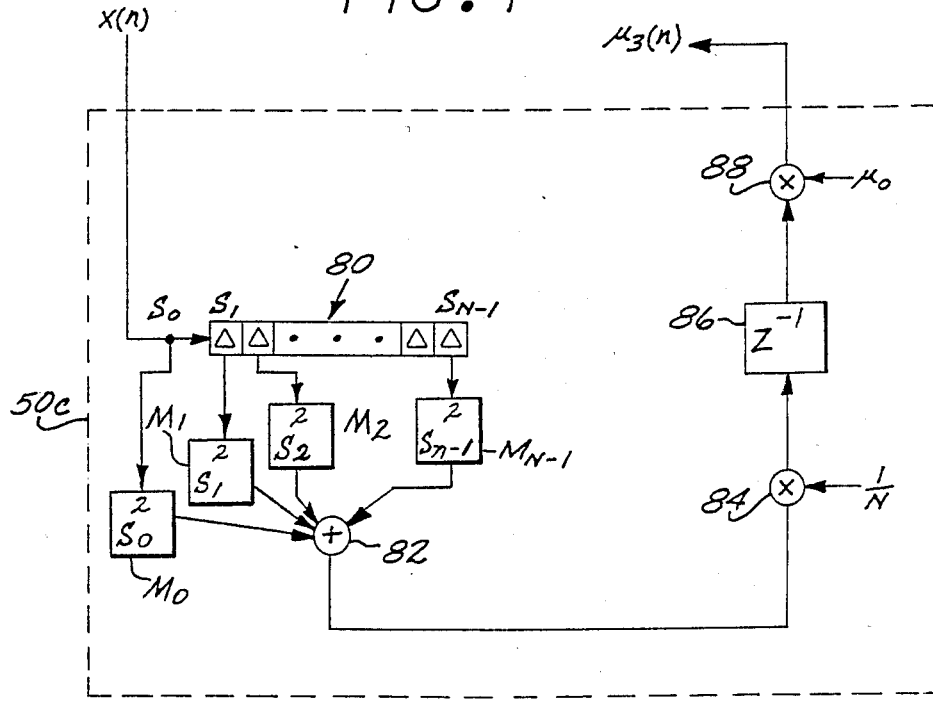
FIG. 4 is a block diagram of a third embodiment of a normalized frequency domain adaptive filter employing the invention.

FIGS. 3 and 4 are respective block diagrams of the nth filter bin of an NFDAF using a tapped delay line to implement the respective relationships of Eqs. 11 and 12 to determine the factor $\mu_2(n)$ and the factor $\mu_3(n)$.

FIG. 3 depicts feedback coefficient circuit 50B, which may be employed in place of circuit 50A in the NFDAF block diagram of FIG. 2. The circuit 50B comprises tapped delay line 70 having N cascaded delay stages $S_1$-$S_N$, each providing a time delay equal to one sample time unit. The magnitudes of the respective tap outputs from the stages $S_1$-$S_N$ are squared by devices $M_1$-$M_N$, and summed at combiner 72. The output of combiner 72 is multiplied by 1/N at multiplier 74. The reciprocal of the multiplier product is formed in device 76, and is multiplied by the scale constant $\mu_0$ at multiplier 78 to form the data dependent feedback coefficient $\mu_2(n)$.

The coefficient $\mu_3(n)$ is formed by circuit 50C of FIG. 4. The circuit 50C is similar to circuit 50B except that the current data waveform x(n) is used in the calculation. Thus, the magnitudes of the respective outputs of stages $S_O$-$S_{N-1}$ of the tapped delay line 80 are squared at devices $M_O$-$M_{N-1}$, and the squared magnitudes are summed at combiner 82. The combined signal is multiplied by 1/N at multiplier 82, and the reciprocal of this product is 30 formed at device 86. The reciprocal is multiplied $\mu_0$ at multiplier 88 to form the feedback coefficient by $\mu_3(n)$.

A frequency domain Least Mean Square adaptive filter has been disclosed which is normalized in each frequency bin by estimates of the input spectral power at that bin. This power normalization implicitly insures filter stability at each frequency bin regardless of the spectral shape of the input signal.

It is understood that the above-described embodiment is merely illustrative of the possible specific embodiments which may represent principles of the present invention. Other arrangements may be devised in accordance with these principles by those skilled in the art without departing from the scope of the invention.

What is claimed is:

1. A method for determining the feedback coefficient in a frequency domain Least Mean Square adaptive filter, comprising the steps of:
   (i) fixing the value of a feedback constant;
   (ii) for each frequency bin of the input signal to the filter, adaptively determining an estimate of the spectral power of the input signal within the particular frequency bin; and
   (iii) for each frequency bin, normalizing the feedback constant as a function of the input spectral power within said frequency bin to provide individual feedback coefficients for each of the frequency bins.

2. The method of claim 1 further comprising the step of iterating steps (ii) and (iii) for successive samples of the input signal taken over an observation time interval.

3. The method of claim 2 wherein said step (ii) of adaptively determining an estimate of the input spectral power comprises the step of recursively determining the estimate in dependence on the present magnitude of the input signal in the frequency bin and the spectral power estimate calculated for the prior iteration.

4. The method of claim 3 wherein said estimate for the (n+1) sample is determined in accordance with the recursive relationship $$\hat{\sigma}^2(n+1) = (1-\alpha)\hat{\sigma}^2(n) + \alpha|x(n)|^2$$

where $\hat{\sigma}^2(n+1)$ and $\hat{\sigma}^2(n)$ represents the estimate of the input spectral power in the respective frequency bin for the nth and (nth+1) sample, $\alpha$ is a weighting constant determining the degree to which the estimate for the preceding sample affects the estimate for the current sample, and x(n) represents nth sample of the input data signal for the respective frequency bin.

5. The method of claim 2 wherein said step (ii) of adaptively determining an estimate of the input spectral power comprises the step of averaging the squares of the magnitudes of the preceding N samples of the input signal in the corresponding frequency bin.

6. The method of claim 2 wherein said step (ii) of adaptively determining an estimate of the input spectral power comprises the step of averaging the squares of the magnitudes of the current and preceding N−1 samples of the input signal in each said frequency bin.

7. A frequency domain Least Main Square adaptive filter, comprising:
   means for respectively transforming an input signal and a reference signal into the frequency domain;
   means for filtering the transformed input signal by an adaptive filter weight;
   means for comparing the filtered, transformed input signal and the transformed reference signal to provide an error signal;
   means for feeding said error signal back to said filtering means for adaptively adjusting said filter weight as a function of said error signal and a feedback coefficient; and
   means for determining said feedback coefficient, comprising:
      (i) means for fixing the value of a feedback constant;
      (ii) means for adaptively determining estimates of the spectral power of the input signal at each frequency bin of the transformed input signal; and
      (iii) means for normalizing said feedback constant by said power estimates within each frequency bin to provide individual feedback coefficients for each of the frequency bins.

8. The filter of claim 7 wherein said filter operates iteratively on successive samples of the input signal over an observation time interval.

9. The filter of claim 8 wherein said means for determining estimates of the input spectral power comprises means for recursively determining said estimates in dependence on the present magnitude of the input signal in the respective frequency bin and the spectral power estimate determined for the prior estimate.

10. The filter of claim 8 wherein said means for determining said estimates comprises means for averaging the squares of the magnitudes of the preceding N samples of the input signal in each said frequency bin to provide a mean average power estimate.

11. The filter of claim 8 wherein said means for determining said estimates comprises means for averaging the squares of the magnitudes of the current and preceding N−1 samples of the input signal in each said frequency bin to provide a mean average power estimate.

* * * * *